United States Patent [19]
Bendall et al.

[11] Patent Number: 4,820,983
[45] Date of Patent: Apr. 11, 1989

[54] METHOD AND APPARATUS FOR PERFORMING AN NMR EXPERIMENT

[76] Inventors: Max R. Bendall, 274 Ford Rd., Burbank, Queensland, Australia; David T. Pegg, 7 Fanfare St., Eight Mile Plains, Queensland, Australia

[21] Appl. No.: 92,919
[22] PCT Filed: Nov. 20, 1986
[86] PCT No.: PCT/AU86/00353
§ 371 Date: Aug. 6, 1987
§ 102(e) Date: Aug. 6, 1987
[87] PCT Pub. No.: WO87/03370
PCT Pub. Date: Jun. 4, 1987

[30] Foreign Application Priority Data
Nov. 20, 1985 [GB] United Kingdom ............... 8528551

[51] Int. Cl.[4] ............................................. G01R 33/20
[52] U.S. Cl. ................................ 324/307; 324/309
[58] Field of Search ............ 324/300, 307, 309, 310, 324/311, 312, 313, 303

[56] References Cited
U.S. PATENT DOCUMENTS
4,390,840 6/1983 Ganssen et al. .................. 324/309
4,528,508 7/1985 Vail III .............................. 324/300
4,535,290 8/1985 Post et al. ......................... 324/309
4,695,799 9/1987 Hardy ................................ 324/307
4,774,466 9/1988 Saffin ................................. 324/309

Primary Examiner—Michael J. Tokar
Attorney, Agent, or Firm—Stanley Z. Cole; Edward H. Berkowitz

[57] ABSTRACT

In a method for NMR excitation of a sample, an Rf pulse is applied to an irradiation coil (6) proximate the sample, in the presence of an external DC magnetic field and an adiabatic passage is performed wherein the Rf pulse is controlled such that:

$$B_1 = VA \sin 2\pi vt \text{ and } \Delta H = A(\cos 2\pi vt + s),$$

or $$B_1 = vA \cos 2\pi vt \text{ and } \Delta H = A(\sin 2\pi vt + s),$$

where $s = S/A$, where S is the frequency offset of a nucleus from the center of the spectrum, and where v allows for variation of $B_1$ throughout the sample, $\Delta H$ is the resonance offset of the nuclear spins, and $B_1$ is the rf field of a spin-lock pulse.

25 Claims, 4 Drawing Sheets

DISTANCE ALONG COLUMN OF WATER, FROM COIL

METHOD AND APPARATUS FOR PERFORMING AN NMR EXPERIMENT

This invention relates to nuclear magnetic resonance (NMR) methods.

One NMR method makes use of the so called "surface coil" defined herein as a coil which provides an inhomogeneous radio frequency magnetic field. The surface coil has proven to be a useful device for irradiation and detection of tissue regions near to the surface of animal or human subjects, particularly for in vivo NMR spectroscopy. Unfortunately, the gross inhomogeneity of the rf field provided by a surface coil leads to complications. If the surface coil is used to transmit a simple square rf pulse, maximum positive signals will be excited from sample regions where the pulse angle $\theta$ is 90°, no signals can be excited in regions where $\theta$ is 180° or 360° and maximum negative signals will be generated from regions where $\theta$ is 270° and so on, where signal excitation is given by sin $\theta$. The sensitivity of the coil to a sample point is proportional to the pulse angle $\theta$ that can be induced at that point, and so the coil is more sensitive to surface regions closest to it. Thus overall, following a square rf pulse, detected signal is proportional to $\theta$ sin $\theta$. A further complication is that various signal regions have a complicated shape. Thus, on the one hand the sample is excited in a grossly non-uniform manner, but on the other hand only crude localisation of the signal from the sample is achieved, so the surface coil is far from ideal from either point of view.

The shape of the rf field provided by a surface coil has been detailed (A. Haase, W. Hanicke and J. Frahm, J. Magn. Reson. 65 401 (1984) (Ref 1) and M. R. Bendall, J. Magn. Reson. 59 406 (1984) (Ref 2) and various methods for improving sample localisation have been reviewed (M. R. Bendall in "Magnetic Resonance (MR) Imaging", 2nd Edition (C. L. Partain, A. E. James, J. A. Patton, R. R. Price and J. P. Jones, Eds), W. B. Saunders, Philadelphia, 1986) (Ref 3).

In accordance with the first aspect of the invention, a method of obtaining a nuclear magnetic resonance signal from a sample using a radio frequency irradiation coil which provides an inhomogeneous radio frequency magnetic field, comprises causing the coil to apply a radio frequency pulse to the sample in the presence of an external magnetic field, performing an adiabatic passage, and obtaining the resultant NMR signal.

Conveniently, the adiabatic passage comprises a so called "half adiabatic rapid passage", as explained in greater detail hereinafter.

The methods in accordance with the invention may be utilised to obtain localisation of N.M.R. signal from regions in space, using switched field gradients.

In accordance with a second aspect of the invention, a method of obtaining a nuclear magnetic resonance signal from a sample, comprises applying a radio frequency magnetic field pulse to the sample in the presence of an external magnetic field, wherein the rf pulse is controlled such that:

$$B_1 = v A \sin 2\pi v t \text{ and } \Delta H = A(\cos 2\pi v t + s),$$

or $$B_1 = v A \cos 2\pi v t \text{ and } \Delta H = A(\sin 2\pi v t + s),$$

where $s = S/A$, where $S$ is the frequency offset of a nucleus from the centre of the spectrum, and where $v$ allows for variation of $B_1$ throughout the sample, $\Delta H$ is the resonance offset of the nuclear springs, and $B_1$ is the rf field of a spin-lock pulse.

In accordance with a third aspect of the invention, a method of obtaining a nuclear magnetic resonance signal from a sample comprises applying a radio frequency magnetic field pulse to the sample in the presence of an external magnetic field, wherein the effective magnetic field applied to the sample is inverted after substantially half the duration of the pulse.

The methods according to the second and third aspects are particularly useful in combination with methods according to the first aspect of the invention. The NMR methods may, for example, form part of an imaging experiment, or a spectroscopy experiment.

Some examples of methods in accordance with the present invention and an example of apparatus for carrying out such methods will now be desribed with reference to the accompanying drawings, in which.

Figure 5:
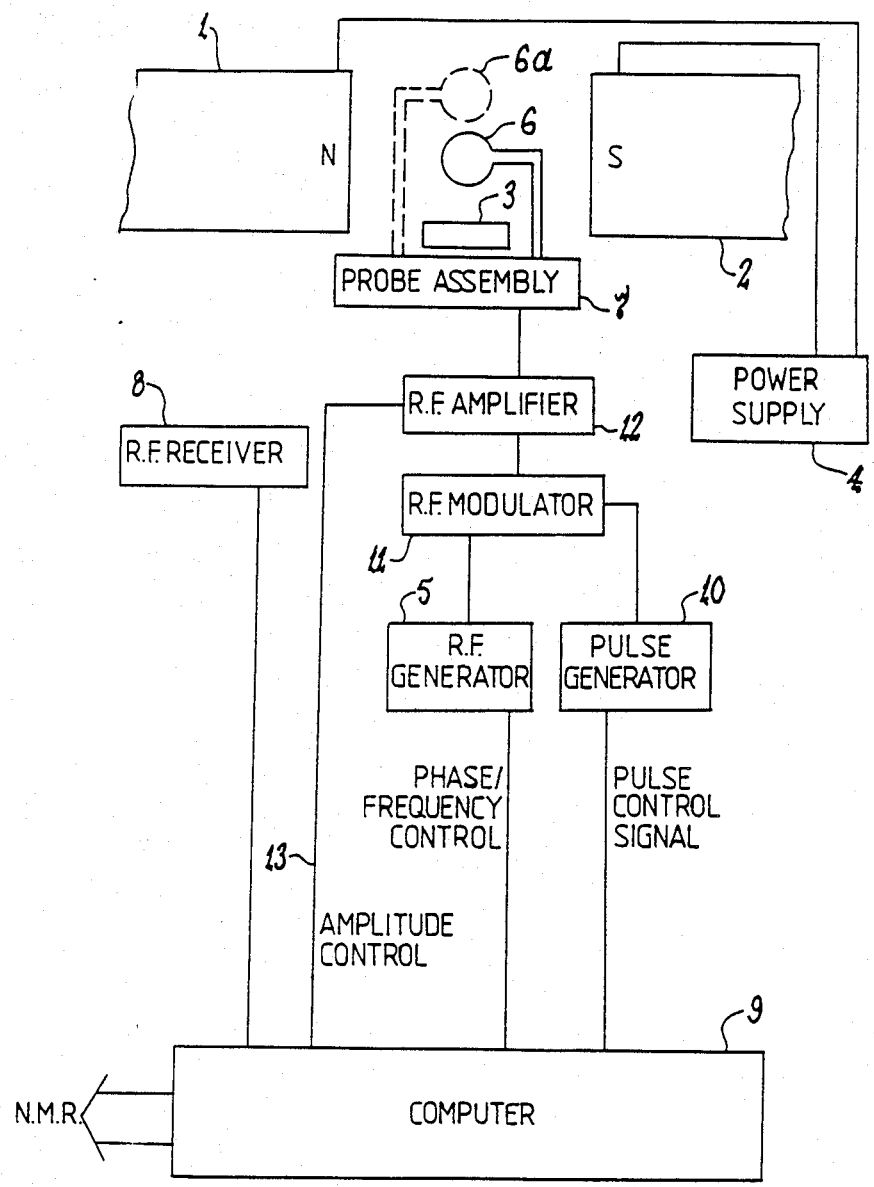
FIG. 5 is a schematic diagram of apparatus for performing the methods described.

The apparatus illustrated in FIG. 5 comprises a magnet assembly having north and south poles 1 and 2, and a sample support 3, positioned to support the sample, for example a human patient, between the pole pieces 1 and 2. The magnet assembly may be a permanent magnet assembly, but is preferably a superconducting electro-magnet, powered by a power supply 4. Rf generator 5 is provided to supply an Rf signal to a sample on the sample support, by means of an Rf coil 6. The Rf coil 6 is mounted on a probe assembly 7 of conventional form.

An Rf receiver 8 is connected to a suitable receiving antenna, which may be the coil 6, or may be one or more other coils of conventional form, for example a coil 6a as illustrated schematically in FIG. 5. The Rf generator 5 and Rf receiver 8 are connected to a computer 9, programmed and arranged to control the phase and frequency of Rf signals produced by the Rf generator 5, and to receive signals from the Rf receiver 8 and process them as indicated herein, in order to obtain the desired NMR signal.

A pulse generator 10 is also controlled by computer 9. The output from the pulse generator 10 is fed to an Rf modulator 11, which modulates the Rf signal produced by the Rf generator 5, thereby to produce the desired sequence of Rf pulses. The sequence of Rf pulses is amplified by Rf amplifier 12, which not only controls the overall amplitude of Rf pulse signals fed to the probe assembly 7, but also, by means of control link 13, can control the relative amplitudes of individual Rf pulses, under the control of the computer 9.

The computer 9 is so programmed and arranged as to produce the desired pulse range, as disclosed herein, according to methods which are generally known per se.

Figure 1:
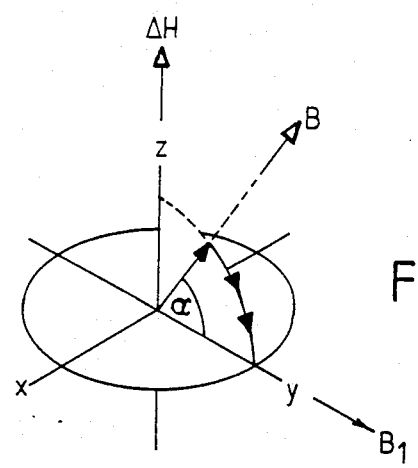
FIG. 1 is a schematic magnetisation diagram.

Referring now to FIG. 1, the diagram illustrates magnetisation component spin-locked $\Delta H$ (Hz) off-resonance by the effective field B at an angle $\alpha$ to the transverse plane of the rotating frame. For example, if an off-resonance single-frequency pulse is switched on instantaneously, the spin-locked component will be sin α times the initial z magnetisation. If ΔH is then reduced to zero adiabatically the spin-locked component follows B down to the x axis and may be detected.

As illustrated in FIG. 1, if at some sample point in the field gradient the nuclear spins are at a resonance offset of ΔH Hz, and the rf field of the spin-lock pulse is $B_1$(Hz), the spin-locked magnetisation component is at an angle α to the transverse plane and aligned with the effective field B, where α and B are given by $$\tan \alpha = \Delta H/B_1 \text{ and } B=(\Delta H^2 + B_1^2)^{\frac{1}{2}} = B_1 \sec \alpha \quad (1)$$

If the field gradient is switched off, ΔH rapidly reduces to zero and the question arises of whether the spin-locked magnetisation will follow the effective field B as it collapses down to the transverse plane. According to standard texts (T. C. Farrar and E. D. Becker, "Pulse and Fourier Transform NMR", p. 13, Academic Press, New York 1971. (Ref 4)) the spins follow B provided $d\Delta H/dt << B^2$, (units of $Hz^2$) the condition for adiabatic rapid passage. For our purposes this inequality is best recast as $$d\alpha/dt << B \quad (2)$$

where the gyromagnetic ratio μ is understood to be absorbed into the field B.

If the spin-lock pulse is switched on in the presence of the field gradient, then at sample points where $\Delta H > B_1$, the initial angle α is large and most of the initial z magnetisation would be spin-locked along B. Provided the field gradient is switched off slowly enough in accordance with inequality (2), this spin-locked component would be rotated down to the transverse plane and could be detected after switching off the rf pulse —this is known as "half adiabatic passage" in traditional NMR spectroscopy (Ref 4). If the field gradient is perpendicular to the surface coil with the zero-crossing plane of the gradient aligned with the sample surface, then the initial ΔH is small and $B_1$ is large at the sample surface. Thus the initial angle α is small and little of the initial z magnetisation would be spin-locked at the sample surface. In this way a large proportion of maximum possible signal could be detected from moderate depths into the sample, with suppression of surface signals, a crude but potentially useful form of sample localisation. It can be expected that the length of the spin-lock pulse on either side of the gradient switching point needs to be randomised over a series of transients to eliminate any residual un-locked magnetisation not dephased by the switched gradient (Ref 3). The most efficient mathematical form of the time profile of the gradient switching to obey inequality (2) also needs to be established before the conditions of practical viability of this method are known.

Our early research in this area has concentrated on gaining a practical understanding of inequality (2) and this has led to an efficient means of uniformly exciting the sample with a surface coil in the absence of field gradients. For example, if the initial ΔH offset is induced throughout the sample using the main field and then reduced to zero in the presence of a continuous single frequency rf (spin locking) by sweeping the field onto resonance, a large proportion of the sample may experience half adiabatic passage (i.e. equivalent to a 90° pulse) depending on inequality (2). An equivalent experiment is to keep the main field constant and to sweep the frequency of the rf onto resonance. To ensure that the initial effective field B is vertical (α=90°), and thus that all the initial z magnetisation is spin locked, the amplitude of the rf pulse may be increased from zero as its frequency is swept onto resonance. The exact form of this amplitude/frequency modulation is determined by the need to obtain maximum efficiency with respect to inequality (2).

Inequality (2) merely expresses a guiding principle and cannot be extended to an exact equation which determines the detailed behaviour of nuclear spings under the influence of any pulse. However, from (2) it would be reasonable to expect that if dα/dt or B varies during the pulse, the inequality would be less likely to hold throughout the whole pulse. Based on this assumption dα/dt and B should be constant to which we add the already established conditions that $B_1 = 0$ and ΔH is a maximum initially, and $B_1$ is a maximum and ΔH=0 finally. One solution to these boundary conditions is that $$B_1 = A \sin 2\pi\nu t \text{ and } \Delta H = A \cos 2\pi\nu t \quad (3)$$

where t=0 initially and $\nu = \frac{1}{4}T$ Hz finally, where T is the length of the pulse in seconds. From Eq. (1) B and dα/dt are constants in Hz and equal to A and $-\nu$ respectively. We will call this amplitude/frequency modulated pulse an example of a "sin/cos" pulse.

For the particular case of the sin/cos pulse, it is easy to write down equations for the final transverse magnetisation wqhich results from initial z magnetisation by moving to a second rotating reference frame which rotates with the effective field B, i.e., the $\bar{z}$ axis of this second frame is aligned with B and the $\bar{x}$ axis is common with the axis of the normal rotating frame. In this second frame there is an additional fictitious field equal to dα/dt ($=-\nu$) perpendicular to the plane of rotation of the frame, i.e. along the x axis. Thus the overall effective field E in the second frame is tilted by an angle α' from the transverse plane of the second frame where $$\tan \alpha' = A/\nu \text{ and } E = (A^2 + \nu^2)^{\frac{1}{2}} = \nu \sec \alpha', \quad (4)$$

and thus the angle of rotation of initial z or $\bar{z}$ magnetisation around E is given by (using $T = \frac{1}{4}\nu$)

$$\theta'' = \frac{\pi}{2} \sec \alpha' \quad (5)$$

The component of magnetisation still aligned with $\bar{z}$ (i.e. B) at the end of the pulse is given by the $f_{zz}$ term of matrix (11) described in M. R. Bendall and D. T. Pegg, Magn. Reson. Med. 2, 91 (1985) (Ref 5), with α' and θ'' in place of α and θ', which is $$\sin^2(\tan^{-1} A/\nu) + \cos^2(\tan^{-1} A/\nu) \cos\left(\frac{\pi}{2} \sec \alpha'\right) \quad (6)$$

This is the component which can be considered to have "followed" the rotating B field down to the y axis of FIG. 1, or undergone half adiabatic passage. For example, the final y component is more than 90% of the initial z magnetisation for A/ν>3 (i.e. |dα/dt| <B/3, relating back to inequality (2)), and is more than 98% for A/ν>7.

For a surface coil, the situation is more complex than that described by Eqs (3) to (6) because of the inhomogeneous rf field, and because we are concerned with a spectrum of nuclear spins. Thus Eqs. (3) becomes $$B_1 = \nu A \sin 2\pi\nu t \text{ and } \Delta H = A(\cos 2\pi\nu t + s), \quad (7)$$

where $s = S/A$, where $S$ is the frequency offset of a nucleus from the centre of the spectrum, and where $\nu$ allows for variation of $B_1$ throughout the sample. Since $B$ and $d\alpha/dt$ are no longer constant, an explicit equation like (6) cannot be written down. Instead it is necessary to split the complex pulse into a large number of pulse increments (e.g. 250), where each increment has constant amplitude and frequency, and determine the effect of each increment using a suitable rotation matrix such as matrix (11) of Ref (5). For the ideal case ($\nu=1$, $s=0$), calculations using 250 increments gave the same results to at least 3 significant figures as those obtained using Eq.(6). Further calculations show that for $A/\nu=18$, the final magnetisation is more than 95% of the initial z magnetisation in the range $0.5 \leq \nu \leq 5$, i.e. for a factor of 10 variation in $B_1$ across the sample. Up to a further 5% of signal is lost for $-0.2 \leq s \leq 0.2$.

If the spectrum width $S$ is $\pm 250$ Hz and the limits of $s$ are $\pm 0.2$, then $A$ should be 1250 Hz. Since $\nu = 1.6$ at the midpoint of the range $0.5 \leq \nu \leq 5$, this corresponds to a maximum $B_1$ of $1.6 \times 1250$ Hz at the end of the sin/cos pulse, which is equivalent to a 90° pulse time ($t_{90}$) for a square pulse of 130 μs, a readily achievable figure for surface coils and in vivo samples given about 1 kw of available pulse power. Thus in practice a sin/cos pulse will adequately cover a reasonable spectral width. If $A/\nu=18$, the length of the pulse T is 3.6 ms, which is quite short relative to $T_1$ relaxation times of in vivo species of interest, another important factor. Thus the sin/cos pulse is quite practical in terms of length and required pulse power and theory shows that it will provide the equivalent of a 90° pulse across a reasonable spectral width for at least a factor of 10 variation in rf field strength in the sample.

We have tested the sin/cos pulse experimentally and have found agreement with the theoretical predictions. Frequency modulation of rf pulses was not available so phase modulation was used instead. Since phase is the integral of frequency, the phase was modulated as $(A/2\pi\nu) \sin 2\pi\nu t$ using 256 pulse increments. An obvious first demonstration utilised a small water phantom at the centre of a large surface coil. The sin/cos pulse induced a similar signal response to that provided by a 90° square pulse, and the phase and the amplitude of the signal was remarkably insensitive to changing the transmitter pulse power.

Figure 2:
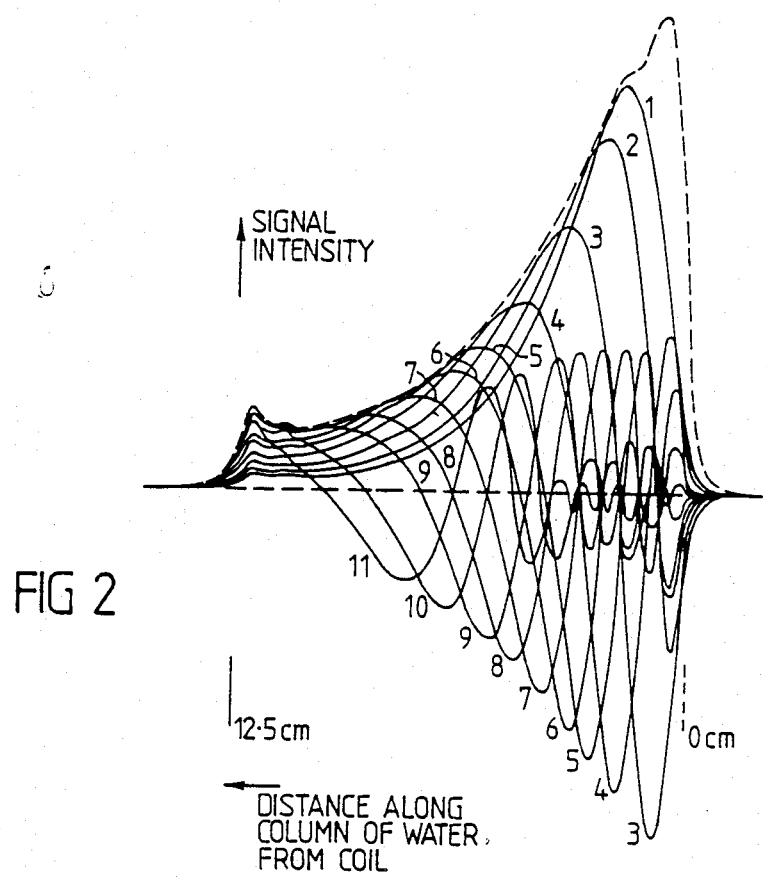
FIG. 2 is a diagram showing signal response as a function of distance in an experiment using a surface coil.

A more stringent test is illustrated in FIG. 2 which shows one-dimensional images of the signal response from a column of water placed perpendicularly on top of the surface coil wire. The figure illustrates signal responses as a function of distance in the xy plane from a 7 cm diameter surface coil for a 12.5 cm long perpendicular column of water, for square pulses (continuous curves numbered 1 to 11) and for the sin/cos pulse (dashed curve). The square pulse lengths were 40, 50, 70, 100, 133, 160, 200, 250, 300, 400 and 500 μs respectively. The length of the sin/cos pulse was 3.77 ms, $A/\nu$ was 18.8 and $\nu=1.6$ approximately at the midpoint of the water column. The maximum possible signal decreases with distance from the coil in accordance with the decreasing sensitivity of the coil to remote samples. The square pulses (of x phase) and the sin/cos pulses were followed by a 25 ms spin-lock pulse of y phase, during the central 5 ms of which a read-out gradient was switched on. The read-out gradient was weak (60 Hz/cm) and the zero-crossing point was near the remote end of the water column so that signal loss from off-resonance effects in the gradient was less than 2%. The long spin-lock pulse ensured that any unlocked components were efficiently dephased. The small increase in signal at greatest distance from the coil is caused by a fortuitous juxtaposition of the weak field gradient and main field inhomogeneity at the water/air interface. Measurements were carried out on a Biospec spectrometer (2.0 T). FIG. 2 compares the response from square pulses of different lengths to that obtained with the sin/cos pulse. A weak "read-out" field gradient parallel to the column of water was switched on during a spin-lock pulse subsequent to the square or sin/cos pulses and left on during signal acquisition to spatially encode the signal response along the water column. The physical dimensions of coil and column ensured at least a factor of 17 variation in rf field strength along the column as indicated by the numerous oscillations between positive and negative signal for the longer square pulses. In comparison, the sin/cos pulse gave only positive signal and this was close to the maximum possible along the whole length of the column. FIG. 2 also illustrates the interference that must be generated between positive and negative signals, resulting in signal loss, when using long square pulses to sample increased depths, and that this is avoided by use of the sin/cos pulse.

The sin/cos pulse should be useful in maximising signal-to-noise in in vivo spectroscopy in situations where localisation beyond that determined by the sensitivity of the surface coil is not required. The importance of maximising S/N using complex pulses has been recognised (M. S. Silver, R. I. Joseph and D. I. Hoult, J. Magn. Reson 59,347 (1984) (Ref 7)). There may also be applications in high-resolution NMR since the pulse is superior to the best available 90° composite pulse (R. Tycko, H. M. Cho, E. Schneider and A. Pines, J. Magn. Reson. 61 90 (1985) (Ref 6)). Whilst the sin/cos pulse is efficient, other pulses such as one half of the sech/tanh pulse of Silver et al may be used.

The adiabatic 90° excitation pulse described can readily excite more than 90% of possible NMR signal across a factor of 10 variation in rf field strength and over a reasonable spectral width. This rf pulse is an amplitude/frequency modulated pulse called a "sin/cos" pulse during which the amplitude and frequency are modulated as one quarter of a complete cycle of sine and cosine functions respectively. Doubling the length of the pulse to one half of complete sine and cosine cycles generates a 180° inversion pulse which is similarly insensitive to variation in the $B_1$ field and is related to the sech/tanh inversion pulse of Silver et al (Ref 7). Like the sech/tanh pulse, the sin/cos 180° inversion pulse is useful over a reasonable spectral width, or it may be utilised in a pulsed field gradient for slice selection in imaging or localised spectroscopy. Our calculations indicate that the sin/cos 180° pulse has an advantage in length and sometimes maximum required rf power over the equivalent sech/tanh pulse for these applications.

It should also be noted that reversing the sin/cos pulse to cos/sin (for the case ending at cos 180° and sin 180°) gives a good 180° spin-echo or refocusing pulse.

It might be expected that a 180° inversion pulse could also function as a 180° refocusing pulse especially since it can be readily shown that for any pulse the proportion of z magnetisation that is inverted is exactly equivalent to the proportion of transverse magnetisation that is refocused (M. R. Bendall and D. T. Peggy, J. Magn Reson. 63 494 (1985) (Ref 8)). However, for a refocusing pulse, there is the additional requirement that the phase of the refocused magnetisation be constant under the relevant variable conditions which in our case are variable $B_1$ and variable resonance offset $\Delta H$. Unfortunately both the sin/cos and sech/tanh 180° pulses generate refocused magnetisation with widely varying phase depending on the magnitude of $B_1$. We show below that this phase problem can be eliminated or reduced by inverting the effective field, B, halfway through the pulse. We signify these "B flips" by $(+-)$ added to our previous nomenclature, e.g. sin/cos$(+-)$.

To determine the effectiveness of various refocusing pulses it is necessary to unambiguously calculate the magnitude and phase of the refocussed component resulting from transverse magnetisation of any phase prior to the pulse. We are not interested in the individual components of x, y and z magnetisation, but only in the refocused component. By definition this is the component of transverse magnetisation which is independent of field homogeneity, and such other effects as heteronuclear coupling, after a spin-echo delay that is symmetric around the refocusing pulse. From previous work Ref 8, R. Kaiser, E. Bartholi, and R. R. Ernst, J Chem Phys 60 2966 (1974) (Ref 9) and G. Bodenhausen, R. Freeman, and D. L. Turner, J. Magn. Reson. 27 511 (1977) (Ref 10) we know that all other magnestisation components are eliminated and only the refocused component is detected if the refocusing pulse is cycled through all four phases ($[\pm x, \pm y]$) during a series of 4 successive transients with receiver inversion corresponding to the y phases. This is true of any refocusing pulse whether simple (square), composite or complex (modulated amplitude or frequency) because any pulse leads to an overall rotation of say $\theta$ about an axis tilted some angle $\alpha$ from the xy plane at some phase angle $\beta$ to the x axis of the rotating reference frame. The rotation matrix for such a general pulse is (Ref 8).

$$F(\theta[\beta], \alpha) = \begin{bmatrix} f_{xx} = \sin^2\beta\cos\theta + \cos^2\beta & f_{xy} = \sin\alpha\sin\theta - \sin2\beta & f_{xz} \\ \times (\cos^2\alpha + \sin^2\alpha\cos\theta) & \times \cos^2\alpha\sin^2(\theta/2) & \\ f_{yx} = -\sin\alpha\sin\theta - \sin2\beta & f_{yy} = \cos^2\beta\cos\theta + \sin^2\beta & f_{yz} \\ \times \cos^2\alpha\sin(\theta/2) & \times (\cos^2\alpha + \sin^2\alpha\cos\theta) & \\ f_{zx} & f_{zy} & f_{zz} \end{bmatrix} \quad (8)$$

and the cycle matrix (Ref 9) for the complete four phase cycle is (Ref 8)

$$f(\theta[\beta \pm x, \beta \pm y], \alpha) = \cos^2\alpha\sin^2(\theta/2) \begin{bmatrix} \cos2\beta & -\sin2\beta & 0 \\ -\sin2\beta & -\cos2\beta & 0 \\ 0 & 0 & 0 \end{bmatrix} \quad (9)$$

Thus $\cos^2\alpha\sin^2(\theta/2)$ is the refocused component and $2\beta$ is its phase angle relative to the x axis resulting from any refocusing pulses. For a composite or complex pulse wear do not readily know what $\theta$, $\alpha$ and $\beta$ are though these could be calculated for any particular conditions of available offset rf power and resonance offset. However a more simple procedure has been developed by recognising from equation (8) that $$\text{refocused component} = \cos^2\alpha\sin^2(\theta/2) \quad (10)$$
$$= \frac{1}{2}[(f_{xx} - f_{yy})^2 + (f_{xy} + f_{yx})^2]^{\frac{1}{2}}$$

and $$\tan 2\beta = -(f_{xy} + f_{yx})/(f_{xx} - f_{yy}) \quad (11)$$

The matrix terms, $f_{xx}, f_{yx}, f_{xy}$ and $f_{yy}$ are of course the individual components of x and y magnetisation resulting from unit x or y magnetisation prior to the pulse as expressed by $$\begin{bmatrix} f_{xx} \\ f_{yx} \\ f_{zx} \end{bmatrix} = f(\theta[\beta], \alpha) \times \begin{bmatrix} 1 \\ 0 \\ 0 \end{bmatrix} \quad (12)$$

$$\begin{bmatrix} f_{xy} \\ f_{yy} \\ f_{zy} \end{bmatrix} = f(\theta[\beta], \alpha) \times \begin{bmatrix} 0 \\ 1 \\ 0 \end{bmatrix} \quad (13)$$

These terms may be calculated for any complex pulse by splitting it into a sufficiently large number (1000 increments or greater) of successive square pulses with corresponding successive application of the Bloch equations. Alternatively and equivalently, the effect of the successive pulse increments can be calculated by successive application of matrix (8). Generally the phase $\beta$ is constant (zero) except at the B flip where it is inverted (180°). The tilt angle $\alpha$ is given by the resonance offset ($\Delta H$, Hz) of the rf by $$\tan\alpha = \Delta H/B_1 \quad (14)$$

and the increased rotation $\theta'$ around the tilted axis for each pulse increment, which takes the place of $\theta$ in matrix (8) for this application is given by $$\theta' = \theta \sec\alpha \quad (15)$$

where $\theta$ would be the equivalent on-resonance rotation ($\alpha = 0$) for that pulse given by $$\theta = 2\pi B_1 T/n \text{ radians,} \quad (16)$$

where T is the length of the complete pulse divided into n increments and the units of $B_1$ are hertz ($B_1 = 1/t_{360}$ is the on-resonance 360° pulse time, and easily determined experimental factor).

Suitable equipment including the capacity for continuous rf or phase modulation was not available during the development of the following pulses, so they have not been checked experimentally. To be confident that inadvertent errors have been excluded, the calculations were made using the Bloch equations and checked in a separate laboratory using the above more explicit rotation matrix approach. These calculations which utilised a large number of small pulse incrementations to mimic the complete pulse also gave the same results as the explicit equations described below, which are valid for the special case of ideal conditions ($v=1$, $s=0$ as signified below). Note also that the original sin/cos pulse has been tested experimentally, and gave results in accordance with similar theoretical calculations.

In simple terms, a refocusing pulse is one which inverts x magnetisation but retains y magnetisation (or vice versa). We first considered a cos/sin 180° pulse which simply has the amplitude and frequency modulation functions swapped compared to the original sin/cos pulse i.e. $B_1$ A $\cos2\pi vt$ and $\Delta H = A \sin2\pi vt$ extending from $t=0$ to $t=\frac{1}{2}v$. Under suitable conditions which obey the inequality $$|d\alpha/dt| << B \tag{17}$$

x magnetisation will be spin locked by the initial conditions of large $B_1$ on-resonance and remain spin locked as the effective field rotates up to the z axis midway through the pulse and then down to the $-x$ axis, i.e. x magnetisation is cleanly inverted. Unfortunately it is easily shown that y magnetisation fluctuates wildly with different pulse lengths or variable $B_1$. However, if both the frequency offset and the $B_1$ field is inverted halfway through the pulse, i.e. the pulse is described by $B_1 = A\cos2\pi vt$ and $\Delta H = A \sin2\pi vt$ for $t=0$ to $\frac{1}{4}v$ and $B_1 = -A \cos2\pi vt$ and $\Delta H = -A \sin 2\pi vt$ for $$t = \tfrac{1}{4}v \text{ to } \tfrac{1}{2}v \tag{18}$$

the effective field B is immediately flipped to the $-z$ axis but rotates in the same sense back to the x axis at the end of the pulse. Initial x magnetisation remains spin locked during the instantaneous B flip and rotates in the same sense down to the $-x$ axis as before, but it can be expected that the precession of initial y magnetisation will be substantially reversed and cancel out during the second half of the pulse. Detailed calculations show that this is true so that the refocused component has a magnitude of >95% and a phase variation of <10° over a factor of 10 variation in $B_1$ power for a reasonable pulse length, but unfortunately the pulse is very sensitive to off-resonance effects.

To invert x magnetisation but retain y magnetisation, a pulse must also invert z magnetisation, i.e. it must rotate a plane of spins 180° around the y axis. Thus in a general sense we seek any good 180° plane rotation pulse. As previously explained, we know that the sin/cos 180° pulse inverts z magnetisation, and this property will be retained by including a B flip as in the sin/cos (+ −) pulse, i.e. the pulse is described by $$B_1 = A\sin2\pi vt \text{ and } \Delta H = -A\cos2\pi vt \text{ for } t = 0 \text{ to } \tfrac{1}{4}v \text{ and} \tag{19}$$

$$B_1 = -A\sin2\pi vt \text{ and } \Delta H = -A\cos2\pi vt \text{ for } t = \tfrac{1}{4}v \text{ to } \tfrac{1}{2}v$$

If the B flip leads to retention of one of x and y magnetisation, then the other transverse component must be inverted since z magnetisation is inverted. Thus the sin/cos (+ −) pulse would be a refocusing pulse and detailed calculations show this to be true.

Under the ideal conditions expressed by equation (19), explicit equations can be derived for the complete pulse in a similar fashion to those equations derived for the original sin/cos 90° pulse, by moving to a second rotating reference frame which rotates with the effective field B. In this second frame any initial magnetisation will rotate an angle $\theta''$ during the first half of the pulse around the effective field E which is at an angle $\alpha'$ to the transverse plane of the second frame where $$\tan\alpha' = A/v \text{ and } \theta'' = \frac{\pi}{2} \sec\alpha' \tag{20}$$

For the second half of the pulse E makes an angle of $-\alpha'$ to the transverse plane of the second frame (B flips but $d\alpha/dt$ remains the same), and initial magnetisation will rotate a second angle $\theta''$ ($\pi/2 \sec \alpha'$) around the new direction of E. The overall rotation matrix for the rotation of initial magnetisation in the second reference frame is given by $$f'(v'',\alpha') = f(\theta[x],\alpha) \, X \, f(\theta[x], -\alpha), \tag{21}$$

where $f(\theta[x],\alpha)$ is matrix (11) of Ref (5) and $\theta''$ and $\alpha'$ replace $\theta'$ and $\alpha$ respectively in the latter matrix. Denoting the various terms in $f'(\theta'',\alpha')$ by $f_{\overline{mn}}$ it can be readily seen that the relevant terms for the rotation in the first rotating reference frame are given by $$f_{xx}=f'_{\overline{xx}},\, f_{yy}=f'_{\overline{yy}},\, f_{yx}=f'_{\overline{yx}} \text{ and } f_{xy}=f'_{\overline{xy}} \tag{22}$$

assuming the initial rf has y phase. Since in this case $f_{xy}= -f_{yx}$, from equation (11), $2\beta=0$, which is very encouraging and from equation (10) the magnitude of the refocused component as a fraction of unity is given by $$\tfrac{1}{2}[(\cos^2\alpha' +\sin^2\alpha'\cos\theta'')^2 +2\sin^2\alpha'\sin^2\theta'' -\sin^22\alpha' \sin^4(\theta''/2)+\cos^2\theta'' -\cos^2\alpha'\sin^2\theta''] \tag{23}$$

where $\theta$ and $\alpha'$ are given by equation (20). Thus, under these ideal conditions the refocused component is more than 90% of initial transverse magnetisation for $A/v>4$ and more than 95% for $A/v>7$, and there are no phase problems. Note that if the initial rf has y phase, x magnetisation is restrained and y magnetisation is inverted by the sin/cos (+ −) pulse.

A complex refocusing pulse is only suitable for practical application if it can be used under variable conditions of rf power across a reasonable spectral width.

Thus equation (19) becomes $$B_1 = vA\sin2\pi vt \text{ and } \Delta H = A(\cos2\pi vt + s) \text{ for } t = 0 \text{ to } \tfrac{1}{4}v \text{ and} \tag{24}$$

$$B_1 = -vA\sin2\pi vt \text{ and } \Delta H = -A(\cos2\pi vt - s) \text{ for } t = \tfrac{1}{4}v \text{ to } \tfrac{1}{2}v$$

where $s=S/A$, where S is the frequency offset of a nucleus from the centre of the spectrum, and where $v$ allows for variation of $B_1$ because of rf homogeneity or experimental misetting. The results of calculations made by splitting the pulse into 1000 increments are shown in FIGS. 3 and 4.

Figure 3:
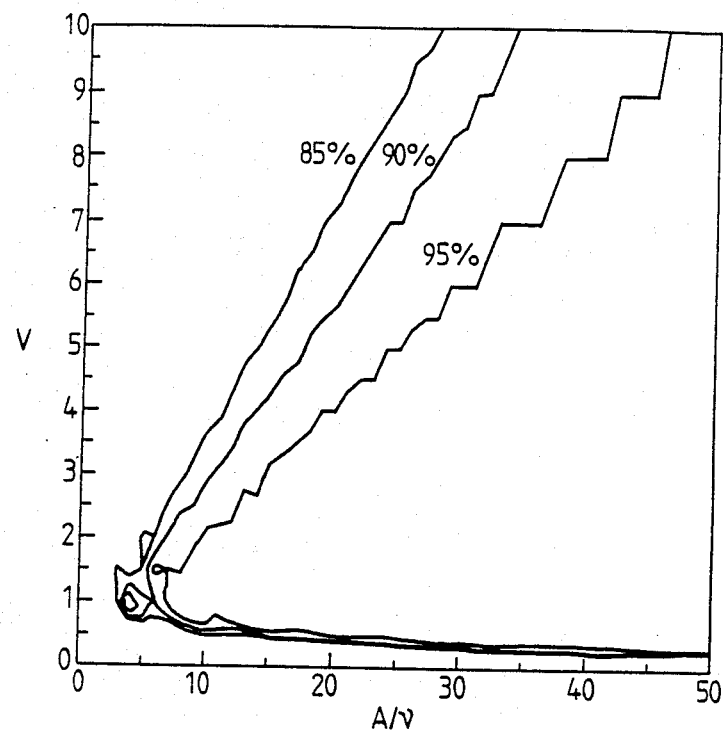
FIG. 3 is a contour plot of the magnitude of the refocussed component versus the variables $v$ and $A/v$.

FIG. 3 is a contour plot of the magnitude of the refocussed component versus the variables v and A/v. A suitable value of A/ν may be chosen from the graph and applied experimentally by matching the length of the pulse (½ν) to the maximum $B_1$ power available (A). For example, at A/ν=20, the rf field strength may vary by a factor of 8 and still produce more than 95% refocusing or by a factor of 14 and produce more than 90% refocusing. The excellent phase properties of the pulse are retained for variable $B_1$ with no significant phase variation (<<1°) for the ranges of A/ν and ν shown in FIG. 3.

Figure 4:
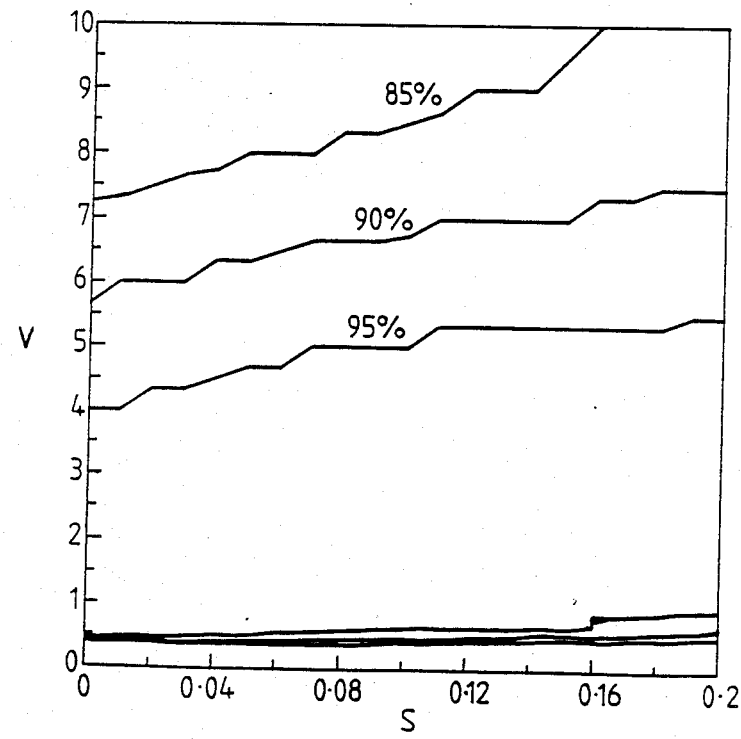
FIG. 4 illustrates the insensitivity of the pulse to resonance offset.

Choosing A/ν=20, FIG. 4 illustrates the insensitivity of the pulse to resonance offset. Thus for a prechosen range of v there is little further signal loss for the range −0.2<s<0.2 and for the whole figure the phase of the refocused component varies by much less than 1°.

Our prime objective is to develop adiabatic rf pulses suitable for application with surface coils for in vivo applications, and thus pulses which compensate for a large variation in $B_1$ field. The sin/cos (+ −) refocusing pulse is compensatory over a similar range to the original sin/cos 90° excitation pulse, except for the fact that the former is of course twice as long as the latter. For example, if the on-resonance 90° pulse time for a square pulse provided by a surface coil is 100 μs at the centre of a region of interest than a 5.7 ms sin/cos (+ −) pulse will refocus more than 90% of all transverse magnetization across a factor of 8 variation of the $B_1$ field around this region centre, and across a spectral width of ±350 Hz. Thus introduction of the effective field (B) flip satisfactorily eliminates the potential phase problem which otherwise prevents the use of adiabatic pulses as refocusing pulses, but retains the insensitivity of the pulse to rf inhomogenity.

The sech/tanh 180° inversion pulse of Silver et al (Ref 7) may also be converted to a refocusing pulse by inclusion of a B flip as in sech/tanh (+ −). However, our preliminary calculations indicate that the sin/cos (+ −) pulse has an advantage in terms of the length of the pulse needed to achieve the same purpose.

It should be noted that the calculations leading to FIGS. 3 and 4 were for the refocused component only. In experimental situations small unrefocused components may dephase efficiently but in situations where these are large they can be eliminated by repeating the experiment with the normal (±x,±y) phase cycling of the refocusing pulse as demonstrated by matrix (9).

Figure 6:
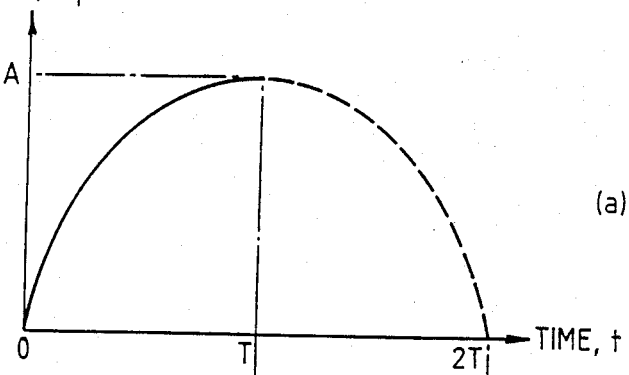
FIG. 6 shows an example pulse sequence.
Figure 6:
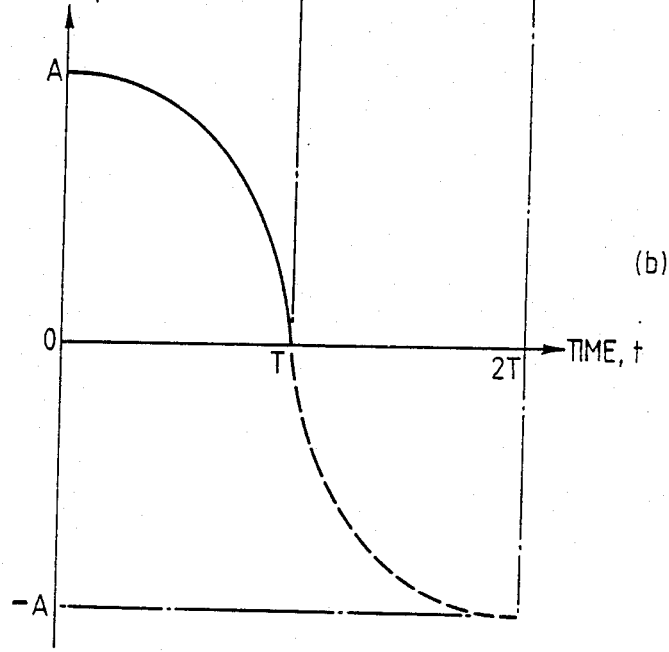

FIG. 6 shows an example radiofrequency pulse sequence. For a sin/cos radiofrequency pulse the amplitude of the radiofrequency signal is modulated as a sine function (a), and the frequency of the radiofrequency signal is concurrently modulated as a cosine function (b). For a sin/cos 90° pulse the pulse is terminated at time T, and for a sin/cos 180° pulse it is terminated at 2T where amplitude B=A sin 2πνt and frequency ΔH=A cos 2πνt and T=¼ν.

We claim:

1. An NMR apparatus for the acquisition of magnetic resonance information from a sample comprising magnetic resonators by one or more pulses of Rf radiation comprising Rf magnetic field $B_1$, said resonators subject to an effective magnetic field B in a frame of reference rotating at Rf frequency $\nu_0$ about an axis defined by an applied dc magnetic field the effective field B a vector comprising resonance offset ΔH and the Rf magnetic field $B_1$, said effective field B at an angle α with to said Rf magnetic field $B_1$, comprising modulation means for controlling both the amplitude and Rf frequency of said pulse to cause said pulse to exhibit a first time dependence in amplitude over the interval defined by said pulse and further to cause said pulse to exhibit a second time dependence in radio frequency over the interval of said pulse, said time dependencies satisfying the conditions wherein
   (a) said effective field B is maintained substantially constant over the interval of said pulse,
   (b) said angle α changes over the interval of said pulse in accord with said modulation, said change comprising a rate dα/dt such that dα/dt is substantially constant over the interval of said pulse and that dα/dt is small compared to B.

2. The apparatus of claim 1, including alignment means for bringing the magnetic resonators into alignment with the effective field B prior to initiation of said pulse.

3. The apparatus of claim 1 or 2, wherein modulation is accomplished such that alignment of the resonators with the effective field B is maintained over the duration of said pulse.

4. The apparatus of claim 1, wherein the modulation means varies the Rf magnetic field from zero amplitude at the initiation of said pulse to a maximum value at the termination of said pulse and said modulation means causes the resonance offset to vary from a maximum value at the beginning of said pulse to zero amplitude at the termination of said pulse.

5. The apparatus of claim 4, wherein the said modulation means is applied to a series of successive Rf pulses.

6. NMR scanner apparatus for the acquisition of magnetic resonance information from a spatially distributed sample containing magnetic resonators by spatially inhomogeneous application of one or more pulses of Rf radiation to generate selected rotation of said magnetic resonators, comprising:
   amplitude modulation means to vary said pulse amplitude in accord with a first sinusoidal function over an interval having a selected initial value and selected final value of argument of said first sinusoidal function,
   frequency modulation means to vary the radio frequency of said Rf pulse in accord with a second sinusoidal function related to said first sinusoidal function by a phase difference of 90°, said second sinusoidal function having selected initial and final values for the argument of said second sinusoidal function,
   whereby substantially uniform rotation of said magnetic resonators are induced over a substantial portion of said spatially distributed sample.

7. The NMR scanner apparatus of claim 6, wherein said first sinusoidal function is a cosine function and said second sinusoidal function is a sine function.

8. The NMR scanner apparatus of claim 6, wherein said first sinusoidal function is a sine function and said second sinusoidal function is a cosine function.

9. The apparatus of claim 7 or 8, wherein the said sinusoidal functions controlling the said modulation means is applied to a series of successive Rf pulses.

10. The NMR scanner of claim 5, wherein the respective arguments of said first and second sinusoidal functions span an identical interval for said pulse.

11. NMR scanner apparatus for the acquisition of magnetic resonance information from a spatially distributed sample containing magnetic resonators by spatially inhomogeneous application of one or more pulses of Rf radiation to generate select nutation of said magnetic resonators, comprising:

amplitude modulation means to vary said pulse amplitude in accord with a first sinusoidal function over interval having a selected initial value and selected final value of argument of said first sinusoidal function and means for inverting the sign of said amplitude midway between initiation and termination of said pulse, frequency modulation means to vary the Rf frequency of said Rf pulse in accord with a second sinusoidal function related to said first sinusoidal function by a phase difference of 90°, said second sinusoidal function having selected initial and final values for the argument of said second sinusoidal function.

12. The apparatus of claim 11, wherein for each said sinusoidal function, said initial value of said argument is 0°, said final value is 180°, whereby a 180° pulse is effective over a substantial portion of said distributed sample.

13. The method of achieving spatially uniform NMR pulse excitation of a distributed sample from an Rf coil proximate the surface of said sample comprising the steps of:

modulating, by a first sinusoidal function, the amplitude of an Rf pulse applied to said Rf coil to impose a time dependence of said amplitude from a selected initial value of the argument of said first sinusoidal function to a selected final argument of the value of said first sinusoidal function, modulating, in accord with a second sinusoidal function related to said first sinusoidal function by a phase difference of 90°, the frequency of said Rf pulse applied to said Rf coil to impose a time dependence of said frequency from a selected initial value of the argument of said second sinusoidal function to a selected final argument value of said second sinusoidal function.

14. The method of claim 13, wherein frequency modulation includes phase modulation.

15. A method of obtaining a nuclear magnetic resonance signal from a sample using a radio frequency irradiation coil which provides an inhomogeneous radio frequency magnetic field, the method comprising causing the coil to apply a radio frequency pulse to the sample in the presence of an external magnetic field, performing an adiabatic passage, and obtaining the resultant NMR signal, said adiabatic passage such that the effective field B experienced by nuclear spins within the sample is changed such that $$|d\alpha/dt| < B$$

$\tan \alpha = \Delta H/B_1$ and $B = (\Delta H^2 + B_1^2)^{\frac{1}{2}} = B_1 \sec \alpha$, $\Delta H$ is the resonance offset of the nuclear spins, and $B_1$ is the Rf field of a spin-lock pulse, said Rf pulse is controlled such that:

$$B_1 = \nu A \sin 2\pi \nu t \text{ and } \Delta H = A(\cos 2\pi \nu t + s),$$

where $S = S/A$, where S is the frequency offset of a nucleus from the center of the spectrum, and where $\nu$ allows for variation of $B_1$ throughout the sample.

16. A method according to claim 15, wherein
$$|d\alpha/dt| << B.$$

17. A method according to claim 15, wherein $|d\alpha/dt| < B$ by at least a factor of two.

18. A method of obtaining a nuclear magnetic resonance signal from a sample using a radio frequency irradiation coil which provides an inhomogeneous radio frequency magnetic field, the method comprising causing the coil to apply a radio frequency pulse to the sample in the presence of an external magnetic field, performing an adiabatic passage, and obtaining the resultant NMR signal, said adiabatic passage such that the effective field B experienced by nuclear spins within the sample is changed such that $$|d\alpha/dt| < B$$

$\tan \alpha = \Delta H/B_1$ and $B = (\Delta H^2 + B_1^2)^{\frac{1}{2}} = B_1 \sec \alpha$, $\Delta H$ is the resonance offset of the nuclear spins, and $B_1$ is the Rf field of a spin-lock pulse, said Rf pulse is controlled such that:

$$B_1 = \nu A \sin 2\pi \nu t \text{ and } \Delta H = A(\cos 2\pi \nu t + s),$$

where $s = S/A$, where S is the frequency offset of a nucleus from the center of the spectrum, and where $\nu$ allows for variation of $B_1$ throughout the sample.

19. The method of achieving substantially spatially uniform excitation of a sample comprising magnetic resonators, from a spatially inhomogeneous Rf field, comprising the steps of:

applying a static magnetic polarizing field to said sample along a first axis, generating an Rf magnetic field principally directed along axes other than said first axis, whereby said magnetic resonators experience an effective magnetic field at an angle $\alpha$ to said polarizing field, to align said magnetic resonators with said effective magnetic field, concurrently modulating the amplitude and frequency of said Rf field to expose said sample to Rf irradiation for a discrete interval while (i) maintaining said effective field at a substantially constant magnitude over said interval, (ii) rotating said effective field at a substantially constant rate $d\alpha/dt$ over said interval, (iii) limiting said rate $d\alpha/dt$ to a magnitude small in comparison with the product of the government ratio with said effective field, and (iv) continuing to substantially maintain alignment of said magnetic resonators with said effective magnetic field over said interval.

20. A method according to claim 15 or claim 18, wherein the Rf pulse is controlled such that the phase of the Rf pulse is modulated in accordance with the formula $$(A/2\pi\nu) \sin 2\pi\nu t.$$

21. A method according to claim 20, wherein the pulse length is such that $2\nu t$ varies between zero and $\pi/2$ or between zero and $\pi$ during the pulse.

22. A method of obtaining a nuclear magnetic resonance signal from a sample, the method comprising applying a radio frequency magnetic field pulse to the sample in the presence of an external magnetic field, wherein the Rf pulse is controlled such that:

$$B_1 = V A \sin 2\pi \nu t \text{ and } \Delta H = A(\cos 2\pi \nu t + s),$$

or $$B_1 = \nu A \cos 2\pi \nu t \text{ and } \Delta H = A(\sin 2\pi \nu t + s),$$

where $s=S/A$, where S is the frequency offset of a nucleus from the centre of the spectrum, and where v allows for variation of $B_1$ throughout the sample, $\Delta H$ is the resonance offset of the nuclear spins, and $B_1$ is the Rf field of a spin-lock pulse.

23. The apparatus of claim 1, wherein the modulation means comprises means for varying the Rf magnetic field from a value of zero at the initiation of said pulse to a maximum Rf magnetic field value at the midpoint of said pulse and thence to the value zero at the termination of said pulse while said modulation means concurrently causes the resonance offset to vary from a maximum resonance offset value at the beginning of said pulse to a value of zero at the midpoint of said pulse and thence returns to said maximum resonance offset value at the termination of said pulse.

24. The method of claim 19 wherein said step of concurrently modulating the amplitude and frequency of said Rf field is carried out in accordance with:

$$B_1 = VA \sin 2\pi vt \text{ and } \Delta H = A(\cos 2\pi vt + s),$$

where $s=S/A$, where S is the frequency offset of a nucleus from the center of the spectrum and v allows for variation of $B_1$ throughout the sample, $\Delta H$ is the resonance offset of the nuclear spins, and $B_1$ is the magnitude of the Rf field.

25. The method of claim 19 wherein said step of concurrently modulating the amplitude and frequency of said Rf field is carried out in accordance with:

$$B_1 = vA \cos 2\pi vt \text{ and } \Delta H = A(\sin 2\pi vt + s),$$

where $s=S/A$, where S is the frequency offset of a nucleus from the center of the spectrum and v allows for variation of $B_1$ throughout the sample, $\Delta H$ is the resonance offset of the nuclear spins, and $B_1$ is the magnitude of the Rf field.

* * * * *

UNITED STATES PATENT AND TRADEMARK OFFICE
CERTIFICATE OF CORRECTION

PATENT NO. : 4,820,983

DATED : 4-11-89

INVENTOR(S) : Max Robin Bendall, David T. Pegg

It is certified that error appears in the above-identified patent and that said Letters Patent is hereby corrected as shown below:

Column 14, line 17 change "cos" to --sin--

Column 13, line 59 change "S = S/A" to --s =S/A--.

Signed and Sealed this

Sixth Day of February, 1990

Attest:

JEFFREY M. SAMUELS

*Attesting Officer*     *Acting Commissioner of Patents and Trademarks*